United States Patent [19]
Elliott et al.

[11] Patent Number: 5,727,066
[45] Date of Patent: Mar. 10, 1998

[54] SOUND REPRODUCTION SYSTEMS

[75] Inventors: Stephen John Elliott, Winchester; Philip Arthur Nelson, Southampton; Ian McGregor Stothers, Eastleigh, all of England

[73] Assignee: Adaptive Audio Limited, England

[21] Appl. No.: 655,409

[22] Filed: Apr. 27, 1993

[30]     Foreign Application Priority Data

Jul. 8, 1988 [GB]  United Kingdom ............... 88.16364.7
  May 11, 1989 [GB] United Kingdom ............... 89.10847.6

[51] Int. Cl.$^6$ .................................................. H04R 5/00
[52] U.S. Cl. ........................................................... 381/1
[58] Field of Search ............................. 381/1, 2, 10, 71, 381/20, 26, 103, 83, 93, 17, 18; 364/724.19

[56]             References Cited

U.S. PATENT DOCUMENTS

| | | | |
|---|---|---|---|
| 4,118,599 | 10/1978 | Iwahara et al. | |
| 4,388,494 | 6/1983 | Schone et al. | |
| 4,458,362 | 7/1984 | Berkovitz et al. | 381/103 |
| 4,628,530 | 12/1986 | OpDeBeek et al. | |
| 4,661,982 | 4/1987 | Kitazato et al. | |
| 4,683,590 | 7/1987 | Miyoshi et al. | 381/71 |
| 4,751,739 | 6/1988 | Serikawa et al. | |
| 4,815,139 | 3/1989 | Eriksson et al. | 381/94 |
| 4,910,779 | 3/1990 | Cooper et al. | 381/26 |
| 5,187,692 | 2/1993 | Hangda et al. | 381/17 |

OTHER PUBLICATIONS

Miyoshi and Kaneda, Inverse Filtering of Room Acoustics, Feb. 1988 pp. 145–152.
"Inverse Filtering of Room Acoustics"; Miyashi et al. IEEE Transactions on Acoustics, Speech, and Signal Processing, vol. 36, No. 2, Feb. 1988; pp. 145–152.
"Multichannel Spectral Estimation"; S.L. Marple, Jr.; Digital Spectral Analysis with Applications; 1987; pp. 386–431.
"Equalisation of Room Acoustic Responses Over Spatially Distributed Regions"; K.D. Farnsworth et al; Proceedings of the Institute of Acoustics; Autumn Conference; 1985.
"Spectral, Phase, and Transient Equalization for Audio Systems"; P.M. Clarkson et al; J. Audio Eng. Soc., vol. 33, No. 3, 1985 Mar.; pp.127–132.
"Head–Related Two–Channel Stereophony with Loudspeaker Reproduction"; Damaske; J. of the Acoustical Society of America; Nov. 1970; pp. 1109–1115.
"Controlling Sound–Image Localization in Stereophonic Reproduction*"; Sakamoto et al; J. Audio Eng. Soc., vol. 29, No. 11, Nov. 1981; pp. 794–799.
"Controlling Sound–Image Localization in Stereophonic Reproduction: Part II*"; Sakamoto et al; J. Audio Eng. Soc., vol. 30, No. 10, Oct. 1982; pp. 719–722.
"Invertibility of a room impulse response"; Neely et al; J. Acoust. Soc. Am. 66(1); Jul. 1979; pp. 165–169.
"Inverse Adaptive Modeling, Equalization, and Deconvolution"; Applications, Part V; pp. 231–269.
"Active Vibration Isolation by Cancelling Bending Waves"; Nelson et al; Proc. I.O.A. vol. 10 Part 2 (1988) pp. 588–605.
"Algorithms for the Active Control of Periodic Sound and Vibrations"; S.J. Elliott et al; ISVR Memorandum No. 679, Dec. 1986; pp. 1–16.

*Primary Examiner*—Curtis Kuntz
*Assistant Examiner*—Xu Mei
*Attorney, Agent, or Firm*—Loeb & Loeb LLP

[57]         ABSTRACT

A stereophonic sound reproduction system is aimed at synthesizing at a multiplicity of points (L) in the listening space. An auditory effect obtaining at corresponding points (K) in the recording space, to compensate for crosstalk ($C_{21}$, $C_{12}$) between the loudspeakers, the acoustic response of the listening space, and imperfections in the frequency response of the speaker channels. Each speaker channel incorporates a digital filter (H) with the characteristics of which are adjusted in response to measurements of the reproduced field. The digital filters are provided by an inverse filter matrix (H) of which the matrix elements ($H_{ij}$) are determined by a least squares technique, applied so as to minimize the sum of the squared errors resulting from the difference between the actual system impulse response and a desired impulse response. A full bandwidth signal is transmitted by a bypass route for combination with the output signal (9) from the filter, the bypass route including a delay means (F).

23 Claims, 7 Drawing Sheets

SOUND REPRODUCTION SYSTEMS

This invention relates to sound reproduction systems.

The invention is particularly, but not exclusively, concerned with the stereophonic reproduction of sound whereby signals recorded at a multiplicity of points in the recording space such, for example, as the notional ear positions of a head, are reproduced in the listening space, by being replayed via a multiplicity of speaker channels, the system being designed with the aim of synthesizing at a multiplicity of points in the listening space an auditory effect obtaining at corresponding points in the recording space.

Imperfections in current two-channel stereophonic reproduction are seen to arise principally as a result of three causes:

Firstly, all frequency components of the signal played at each loud-speaker channel are reproduced both at the right and at the left ears of the listener as though the loudspeakers were the signal sources of the relevant frequency components, regardless of the positions at which these components were created in the recording space.

Secondly, the acoustic response of the listening space provides a reverberant field which is additive with the reverberant field of the recording space.

Thirdly, "imperfections" in the frequency response of the speaker channels.

According to one aspect of the invention, a sound reproduction system provided with means for employing a measurement of the reproduced field so as to enhance the accuracy of the reproduction system, is characterised in that the system has a plurality of means for recording signals at a plurality of points within the reproduced field, as well as means for reproducing said signals, using digital filter means, the characteristics of which are determined by a least squares technique.

Preferably signals recorded at a plurality of points in the reproduced field are reproduced at a plurality of points in the listening space via a plurality of speaker channels.

Each of the channels preferably includes a digital filter the characteristics of which are adjusted or set in response to measurements of the reproduced field.

In some situations it may be possible to set once and for all the filter characteristics but usually the reproduced field will be monitored continuously or semi-continuously and the characteristics of the digital filter are adjusted in response to an error signal from the monitor.

The filters are preferably adapted to compensate, at least to a significant degree, for acoustical cross-talk in the reproduced field.

The compensation for acoustical cross-talk may be continuously or semi-continuously reviewed, by monitoring of the reproduced field, to produce an error signal and any adjustments found desirable are automatically made to the relevant filter characteristics in a direction to reduce the error signal.

Preferably the filters are adapted to compensate, at least to a significant degree, for the acoustical response of the space in which loudspeakers supplied by the respective speaker channels are situated.

The least squares technique may be applied by considering the system response to a spectrally broad input signal, the minimum mean squared error being determined by use of an equation of the form $$Jo = E\,[d^T(n)d(n)] - E\,[d^T(n)R]\,ho$$

the filter coefficients being determined by an equation of the form $$ho = [E[R^T R]]^{-1}\,E[R^T d(n)]$$

and employing an algorithm of the form $$h(n+1) = h(n) - \alpha Re(n)$$

to determine said minimum.

The least squares technique is applied so as to minimise the sum of the squared errors resulting from the difference between the actual system impulse response and the desired impulse response.

Any required impulse response may be selected or pre-selected. Thus, for example, a desired reverberation of the room could be chosen.

In a preferred arrangement the digital filter is preceded by a low-pass filter, and a full band-width signal is transmitted by a bypass route for combination with the output signal from the filter, the bypass route including a delay means.

The input to the digital filter is preferably down-sampled to reduce the sample rate and thereby reduce the amount of processing associated with the operation of the filter, the output from the filter being interpolated to increase the sample rate.

A stereophonic form of the system may be provided with an optimiser unit interposed between speaker outputs of the system and the speakers thereof, the optimiser unit having respective optimiser inputs connected to the speaker outputs, respective optimiser outputs connected to the speakers, and an input for receiving a microphone signal from a microphone placed in the reproduced field.

One embodiment of the invention comprises a sound reproduction system for reproducing from signals $x_k$ respectively recorded at K points in the recording space, an approximation to these signals at L points in the listening space using M loudspeaker channels, where L>M>K the K recorded signals $x_k$ being operated on by an M×K matrix of compensating inverse digital filters, prior to their transmission via an L×M matrix of transmission paths, the said inverse digital filters serving to implement an algorithm operating at the inputs to the loudspeaker channels to introduce compensation for acoustical cross-talk, acoustical response of the listening space, and corruptive frequency response characteristics of the loudspeaker channels.

In the limiting case of currently used stereophonic reproduction equipment M=2, and, in general, L=2.

Another embodiment of the invention comprises inverse digital filter means incorporated in the inputs of several loudspeaker channels and operable so as to exhibit a filter characteristic conforming to an algorithm such that input signals to the said channels are modified in amplitude and phase in a manner such that at at least one pair of points, spaced apart in the listening space by a distance corresponding to the spacing of the human ears, the outputs from the loudspeaker channels are mutually compensatory, thereby diminishing cross-talk, compensating for the reverberant field of the listening space, and compensating also for the frequency response of the speaker channels.

BACKGROUND TO THE INVENTION

The general field of the invention is the stereophonic reproduction of sound in which signals recorded at spaced points in the existing sound field such, for example, as the ears of a dummy head, are replayed via two loudspeakers in a listening space with the aim of creating a faithful reproduction of the original recording space sound at the ears of a listener.

It has been recognised that imperfections in the reproduction arise from three main causes:

3

(1) The signal played via the right channel is reproduced at both the right and the left ears of the listener. Similarly, for the signal played via the left channel.

(2) The acoustic response of the listening room provides a reverberant field which is in addition to the reverberant field of the space in which the existing recordings were made.

(3) The frequency response of the loudspeakers used for reproduction is imperfect.

It is the objective of the sound reproduction system described here to achieve the "perfect" reproduction of the recorded signals at the listener's ears. The signals recorded at two points in the recording space are to be reproduced essentially at exactly two points in the listening space.

In order to compensate for the three adverse factors mentioned above, inverse filters are introduced acting as inputs of the loudspeaker channels used for reproduction in order to compensate both for loudspeaker response and as room response. Initial attempts to design such inverse filters for the single channel case have been reported by Farnsworth et al (1) and Clarkson et al (2).

The formulation proposed includes the effective cancellation of undesirable 'acoustical cross talk' provided by the unwanted transmission previously mentioned from the right channel to the left ear and vice versa.

The three problems are thus dealt with in a single formulation which involves, as made apparent hereinafter, the use of a matrix of digital fillers operating on the recorded signals prior to their transmission via the loudspeaker channels.

Preview attempts at addressing certain aspects of the problem of stereophonic fidelity have been made using analogue electronics notably by Atal and Schroeder (3), Damaske (4) and, more recently by Sakamoto et al (5,6).

In the formulation presented here, however, the use of digital techniques is envisaged and the problem can be analysed using a least squares approach.

Two novel solutions to the problem are hereinafter presented, one involving the design of the inverse filter matrix via a "deterministic" least squares method and the other involving the use of a "statistical" least squares technique. The second approach has the merit that it can be made adaptive and offers the possibility of computing the filter matrix in situ in a given listening space. The proposed system consists of a simple addition to existing stereophonic sound reproduction equipment. In simple terms the additional filter matrix can be housed in a "black box" containing the necessary micro-processors programmed to implement algorithms hereinafter mentioned so as to operate on the two output signals produced by existing equipment. The "black box" produces two modified outputs for transmission via the loudspeaker system of the existing equipment.

Additional inputs to the black box are provided by two (or more) microphones which may be placed at the two (or more) positions in the listening space at which the optimal sound reproduction is required. These microphones may be removed after adaptation of the necessary digital filters.

Further, the approach presented has been generalised such that it can be applied to any recording technique involving sensing the sound field with any number or type of transducers.

It is thus not only applicable to dummy head or coincident microphone techniques but also more recent approaches involving the effective detection of the pressure and three components of particle velocity in the sound field.

In either case the approach presented enables the deduction of the inverse filter matrix enabling the production of the best approximation (in the least squares sense) to the recorded qualities in the listening space.

4

The invention will now be further described, by way of example only, with reference to the accompanying drawings in which.

THE INVERSE FILTER MATRIX FOR STEREOPHONIC SOUND REPRODUCTION

Figure 1:
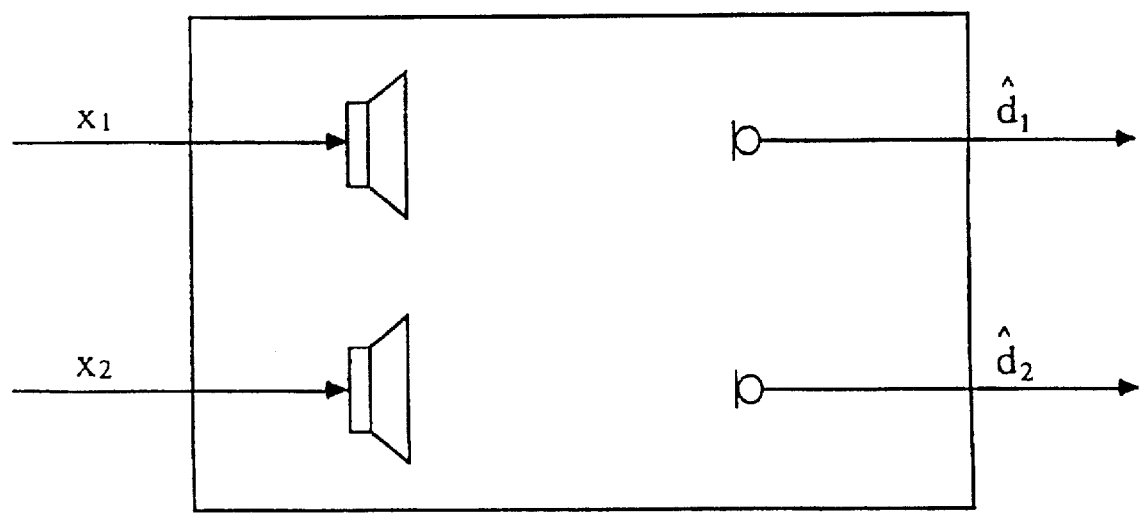
FIG. 1 is a diagram showing a stereophonic sound reproduction system, to illustrate the problem tackled by the invention.
Figure 2:
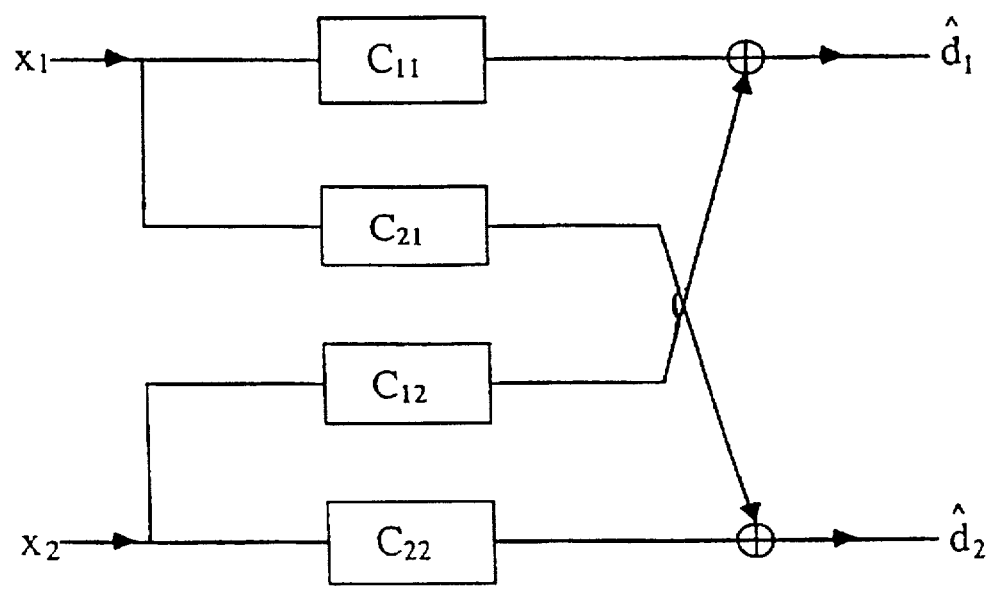
FIG. 2 is a block diagram of a stereophonic sound reproduction system prior to the introduction of compensating filters.
Figure 3:
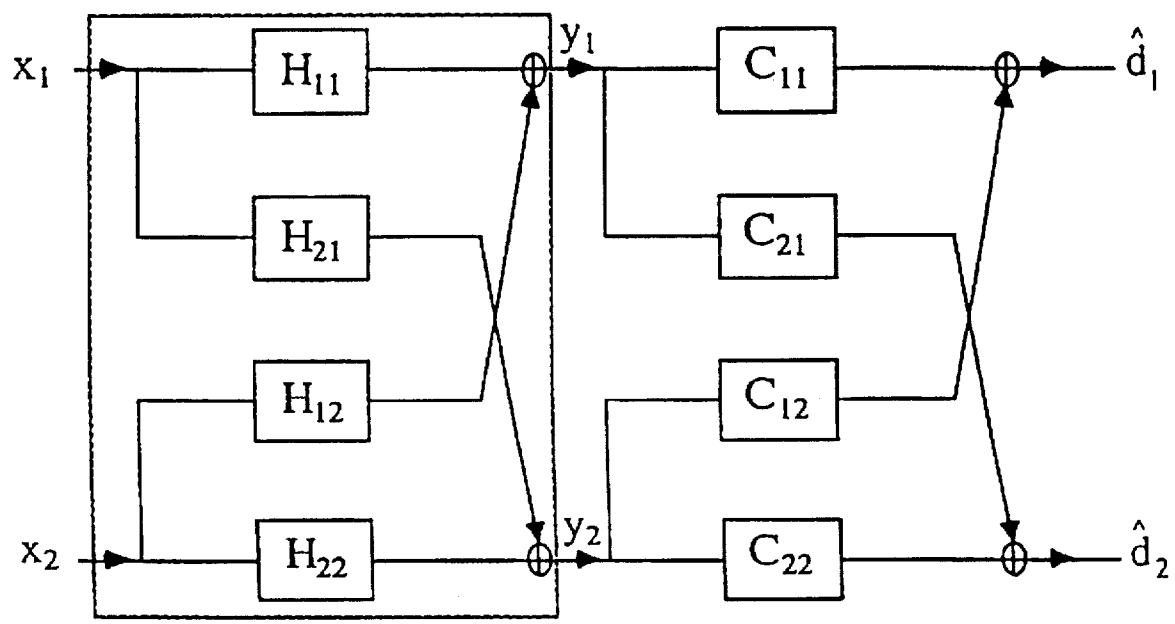
FIG. 3 is a block diagram of the system of FIG. 2 but incorporating a matrix H of inverse filters, in accordance with the invention, $x_1$, and $x_2$ being the recorded signals, and $y_1$ and $y_2$ being the new input signals to the loudspeakers.

The basic problem is illustrated in FIG. 1. The recorded signals $x_1$ and $x_2$ have been produced at, for example, the ears of a dummy head. The objective is to produce precisely the same signals at the ears of a listener. These signals are represented by the outputs $\hat{d}_1$ and $\hat{d}_2$ of microphones placed at, or close to, the ears of the listener. FIG. 2 shows the transmission system in block diagram form, where the transfer functions $C_{lm}$ represent the transmission paths from the loudspeakers to the ears of the listener. For perfect sound reproduction it is assumed that we require $\hat{d}_1=x_1$ and $\hat{d}_2=x_2$. In order to achieve this in principle we must operate on the inputs $x_1$ and $x_2$ with a matrix of filters having elements $H_{mk}$ as shown in FIG. 3. The presence of the diagonal elements $H_{21}$ and $H_{12}$ can be thought of as providing the necessary cancellation of the cross talk signals present in the listening room as a result of the diagonal elements $C_{21}$ and $C_{12}$. In order to find the necessary transfer function matrix H we can work in the frequency domain and define the vector of signals $\hat{d}$ as $$\hat{\underline{d}} = \begin{bmatrix} \hat{d}_1 \\ \hat{d}_2 \end{bmatrix} = \begin{bmatrix} C_{11} & C_{12} \\ C_{21} & C_{22} \end{bmatrix} \begin{bmatrix} y_1 \\ y_2 \end{bmatrix} = \underline{C}\underline{y} \quad (1)$$

where the vector of signals y is defined as $$\underline{y} = \begin{bmatrix} y_1 \\ y_2 \end{bmatrix} = \begin{bmatrix} H_{11} & H_{12} \\ H_{21} & H_{22} \end{bmatrix} \begin{bmatrix} x_1 \\ x_2 \end{bmatrix} = \underline{H}\underline{x} \quad (2)$$

Combination of these equations yields $$\hat{d} = CHx \quad (3)$$

Thus perfect sound reproduction, i.e., such that $\hat{d}=x$, requires $CH=I$ or $H=C^{-1}$. Thus in frequency domain terms the necessary filter matrix H is simply the inverse of the matrix C. However, we cannot compute an exact inverse of the matrix C due to the presence of non-minimum phase components in those transfer functions (it is well known, for example, that the room acoustic transfer function contains significant non-minimum phase elements [7]). It is therefore necessary to take a least squares approach to the design of the inverse filter matrix and in order to do this it helps greatly if the block diagram representation of the composite system shown in FIG. 3 can be rearranged. The necessary rearrangement can be explained simply using a little matrix algebra. Equation (3) can be expanded in full as $$\begin{bmatrix} \hat{d}_1 \\ \hat{d}_2 \end{bmatrix} = \begin{bmatrix} C_{11} & C_{12} \\ C_{21} & C_{22} \end{bmatrix} \begin{bmatrix} H_{11} & H_{12} \\ H_{21} & H_{22} \end{bmatrix} \begin{bmatrix} x_1 \\ x_2 \end{bmatrix} \quad (4)$$

and by expanding the product of the matrix C with the matrix H this can be written in the form $$\begin{bmatrix} \hat{d}_1 \\ \hat{d}_2 \end{bmatrix} = \begin{bmatrix} (C_{11}H_{11}+C_{12}H_{12}) & (C_{11}H_{12}+C_{12}H_{22}) \\ (C_{21}H_{11}+C_{22}H_{21}) & (C_{21}H_{12}+C_{22}H_{22}) \end{bmatrix} \begin{bmatrix} x_1 \\ x_2 \end{bmatrix} \quad (5)$$

It is also evident that this product can be written as $$\begin{bmatrix} \hat{d}_1 \\ \hat{d}_2 \end{bmatrix} = \begin{bmatrix} x_1C_{11} & x_1C_{12} & x_2C_{11} & x_2C_{12} \\ x_1C_{21} & x_1C_{22} & x_2C_{21} & x_2C_{22} \end{bmatrix} \begin{bmatrix} H_{11} \\ H_{21} \\ H_{12} \\ H_{22} \end{bmatrix} \quad (6)$$

where a vector representation of the filter matrix H has now been adopted. If we now define the signals $x_kC_{lm}$ as the "filtered reference signals" $r_{lmk}$ this equation can be further reduced to $$\begin{bmatrix} \hat{d}_1 \\ \hat{d}_2 \end{bmatrix} = \begin{bmatrix} r_{111} & r_{121} & r_{112} & r_{122} \\ r_{211} & r_{221} & r_{212} & r_{222} \end{bmatrix} \begin{bmatrix} H_{11} \\ H_{21} \\ H_{12} \\ H_{22} \end{bmatrix} \quad (7)$$

Figure 4:
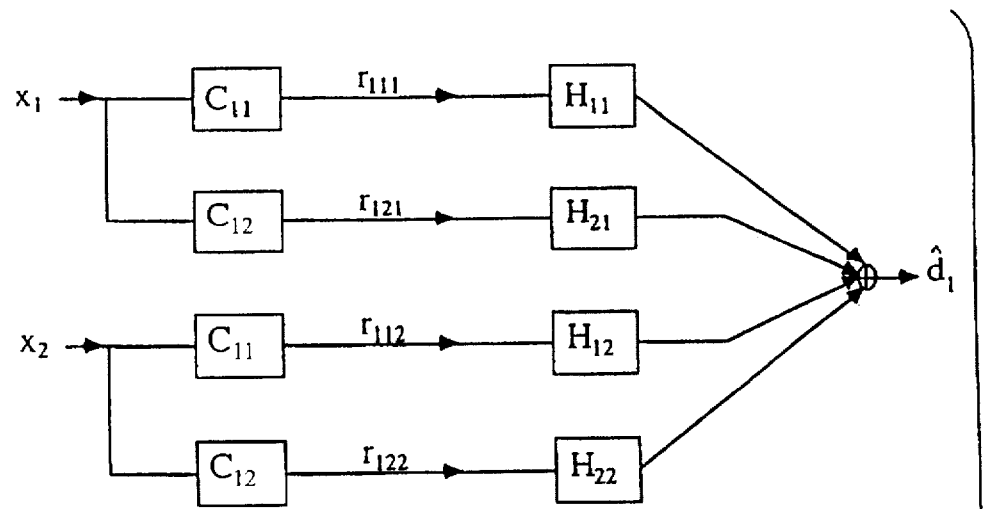
FIG. 4 is an equivalent block diagram relating to the elements of the matrix product H C, and showing the reversal of the order of operation of the elements of H and C.
Figure 4:
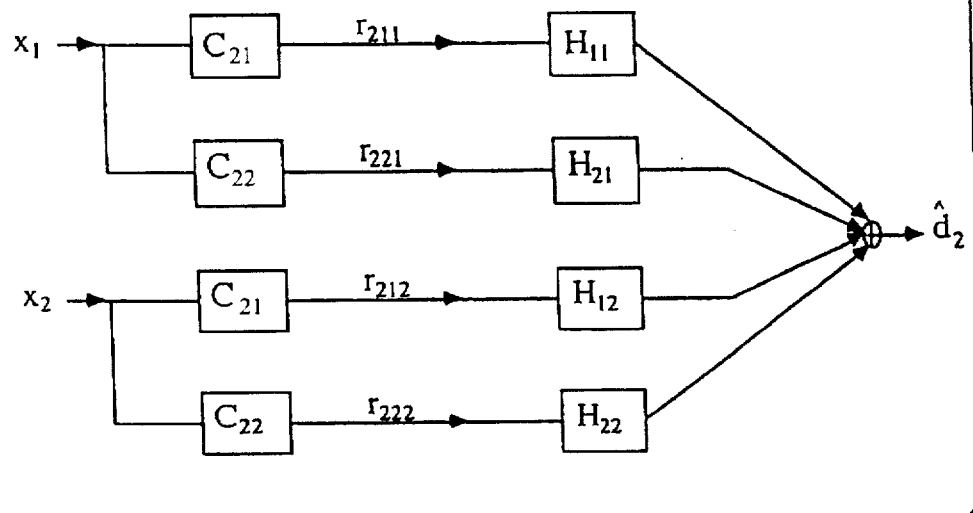

The corresponding block diagram of the rearranged system is shown in FIG. 4, where the input signals $x_1$ and $x_2$ are first passed through the relevant elements of the transfer function matrix C before being passed through the elements of the transfer function matrix H. This approach is thus essentially that taken by Elliott et al [7] in deriving the stochastic gradient algorithm used in problems of active control of periodic noise and vibration, and has been extended for use with multiple input signals by Nelson et al [8]. This block diagram arrangement can now be used to determine the optimal finite impulse response filters comprising the matrix H. Two alternative least squares approaches can be taken to determine the filters which give the "best" transmission properties of the net system.

DETERMINISTIC LEAST SQUARES FILTER DESIGN

In this case we determine the filters comprising H which give the best least squares fit to a desired system impulse response. Firstly note that this requires an exact knowledge of the transfer functions comprising C. Now observe that if the inputs $x_1$ and $x_2$ are both unit impulses (at time index n=0 in discrete time) then the filtered reference signals r(n) wall be given exactly by the impulse responses of the relevant transfer functions in C. Thus the net impulse response of the system (the outputs $\hat{d}_1$ and $\hat{d}_2$) are comprised of convolutions of the form $$c(j)*h(i) = \begin{bmatrix} c(0) & 0 & 0 & 0 \\ c(1) & c(0) & 0 & 0 \\ c(2) & c(1) & c(0) & 0 \\ c(3) & c(2) & c(1) & 0 \\ . & c(3) & c(2) & c(0) \\ . & . & c(3) & c(1) \\ . & . & . & . \\ c(J-1) & . & . & c(2) \\ 0 & c(J-1) & . & c(3) \\ 0 & 0 & c(J-1) & . \\ 0 & 0 & 0 & . \\ . & & & . \\ 0 & 0 & 0 & c(J-1) \end{bmatrix} \begin{bmatrix} h(0) \\ h(1) \\ h(2) \\ h(3) \\ . \\ . \\ h(I-1) \end{bmatrix} \quad (8)$$

where the duration of the impulse responses c(j) is assumed to be J samples and the impulse response of the compensating filters h(i) is assumed to be of duration I samples. Note it is also implicitly assumed that both c(j) and h(i) are causal impulse responses. It therefore follows from the rearranged block diagram as expressed in equation (7) that the net output sequences $\hat{d}_1(n)$ and $\hat{d}_2(n)$ due to unit impulses at the inputs at n=0 can thus be written as a composite sequence vector defined by $$\begin{bmatrix} \hat{d}_1(0) \\ \hat{d}_1(1) \\ \hat{d}_1(2) \\ \vdots \\ \hat{d}_1(I+J) \\ \hline \hat{d}_2(0) \\ \hat{d}_2(1) \\ \hat{d}_2(2) \\ \vdots \\ \hat{d}_2(I+J) \end{bmatrix} = \begin{bmatrix} \begin{array}{cc} c_{11}(0) & 0 \\ c_{11}(1) & c_{11}(0) \\ \vdots & c_{11}(1) \\ c_{11}(J-1) & \vdots \\ 0 & c_{11}(J-1) \end{array} & \begin{array}{cc} c_{22}(0) & 0 \\ c_{22}(1) & c_{22}(0) \\ \vdots & c_{22}(1) \\ c_{22}(J-1) & \vdots \\ 0 & c_{22}(J-1) \end{array} & \begin{array}{cc} c_{11}(0) & 0 \\ c_{11}(1) & c_{11}(0) \\ \vdots & c_{11}(1) \\ c_{11}(J-1) & \vdots \\ 0 & c_{11}(J-1) \end{array} & \begin{array}{cc} c_{12}(0) & 0 \\ c_{12}(1) & c_{12}(0) \\ \vdots & c_{12}(1) \\ c_{12}(J-1) & \vdots \\ 0 & c_{12}(J-1) \end{array} \\ \hline \begin{array}{cc} c_{21}(0) & 0 \\ c_{21}(1) & c_{21}(0) \\ \vdots & c_{21}(1) \\ c_{21}(J-1) & \vdots \\ 0 & c_{21}(J-1) \end{array} & \begin{array}{cc} c_{22}(0) & 0 \\ c_{22}(1) & c_{22}(0) \\ \vdots & c_{22}(1) \\ c_{22}(J-1) & \vdots \\ 0 & c_{22}(J-1) \end{array} & \begin{array}{cc} c_{21}(0) & 0 \\ c_{21}(1) & c_{21}(0) \\ \vdots & c_{21}(1) \\ c_{21}(J-1) & \vdots \\ 0 & c_{21}(J-1) \end{array} & \begin{array}{cc} c_{22}(0) & 0 \\ c_{22}(1) & c_{22}(0) \\ \vdots & c_{22}(1) \\ c_{22}(J-1) & \vdots \\ 0 & c_{22}(J-1) \end{array} \end{bmatrix} \begin{bmatrix} h_{11}(0) \\ \vdots \\ h_{11}(I-1) \\ \hline h_{21}(0) \\ \vdots \\ h_{21}(I-1) \\ \hline h_{12}(0) \\ \vdots \\ h_{12}(I-1) \\ \hline h_{22}(0) \\ \vdots \\ h_{22}(I-1) \end{bmatrix} \quad (9)$$

This equation can be written compactly in matrix form as $$\hat{d}_s = C_s h \quad (10)$$

where the subscript "s" has been used to denote sequence. We now require $\hat{d}_s$ to be a least squares approximation to a desired impulse d. This desired response could be, for example, simply a delayed version of the input x(n). This will allow the incorporation of an appropriate "modelling delay" in the design of the inverse filter and therefore the reudction of the minimum mean square error associated with the least squares estimate (see Widrow and Stearns [10]). Thus, for example, if a delay at n=2 is required, the vector d is given by $$d^T = [0\ 0\ 1\ 0\ \ldots\ 0 \vdots 0\ 0\ 1\ 0\ \ldots\ 0] \quad (11)$$

It should also be noted however that any arbitrary required definition of d could be adopted and in principle a desired reverberation of the room could be incorporated into the formulation.

It may also be useful to select the delay in each of the desired signals differently for each microphone and this selection could also be accomplished adaptively for example to minimise the mean square error.

We thus seek to minimise the sum of the squared errors resulting from the difference between the actual system impulse response and this desired impulse response. This cost function can be defined as $$I = (d - \hat{d}_s)^T (d - \hat{d}_s) \quad (12)$$

which, using equation (9), can be written as $$I = (d - C_s h)^T (d - C_s h) \quad (13)$$

This can be expanded to give the quadratic form defined by $$I = d^T d - 2 d^T C_s h + h^T C_s^T C_s h \quad (14)$$

This function is minimised by the optimal filter vector of filter coefficients defined by $$h_o = [C_s^T C_s]^{-1} C_s^T d \quad (15)$$

with a corresponding minimum mean square error which is given by $$I_o = d^T d - d^T C_s h_o \quad (16)$$

Thus the optimal filter vector $h_o$ can be evaluated by direct inversion of the matrix $[C_s^T C_s]$.

It should be noted that exact measurements of the element comprising $C_s$, i.e., the transmission path impulse responses, are required for the computation.

STATISTICAL LEAST SQUARES FILTER DESIGN

In this approach the system is assumed to be supplied with a spectrally broad "training signal" via the inputs $x_1$ and $x_2$. The resulting outputs can be written (in discrete time) as $$\hat{d}_1(n) = r_1^T h;\ \hat{d}_2(n) = r_2^T h \quad (17)$$

where the vectors of filtered reference signals are given by $$r_1^T = [r_{111}^T\ r_{121}^T\ r_{112}^T\ r_{122}^T] \quad (18)$$

$$r_2^T = [r_{211}^T\ r_{221}^T\ r_{212}^T\ r_{222}^T]$$

Each of the component vectors comprising these vectors of filtered reference signals are sequences of the form $$r_{lmk}^T = [r_{lmk}(n)\ r_{lmk}(n-1)\ r_{lmk}(n-2)\ \ldots\ r_{lmk}(n-I+1)] \quad (19)$$

The vector h is the composite tap weight vector as defined above in equation (9). The net output can thus be expressed as the composite vector $$\hat{d}(n) = R\ h \quad (20)$$

where the vector $\hat{d}(n)$ and the matrix R are defined by $$\hat{d}(n) = \begin{bmatrix} \hat{d}_1(n) \\ \hat{d}_2(n) \end{bmatrix},\ R = \begin{bmatrix} r_1^T \\ r_2^T \end{bmatrix} \quad (21)$$

Figure 5:
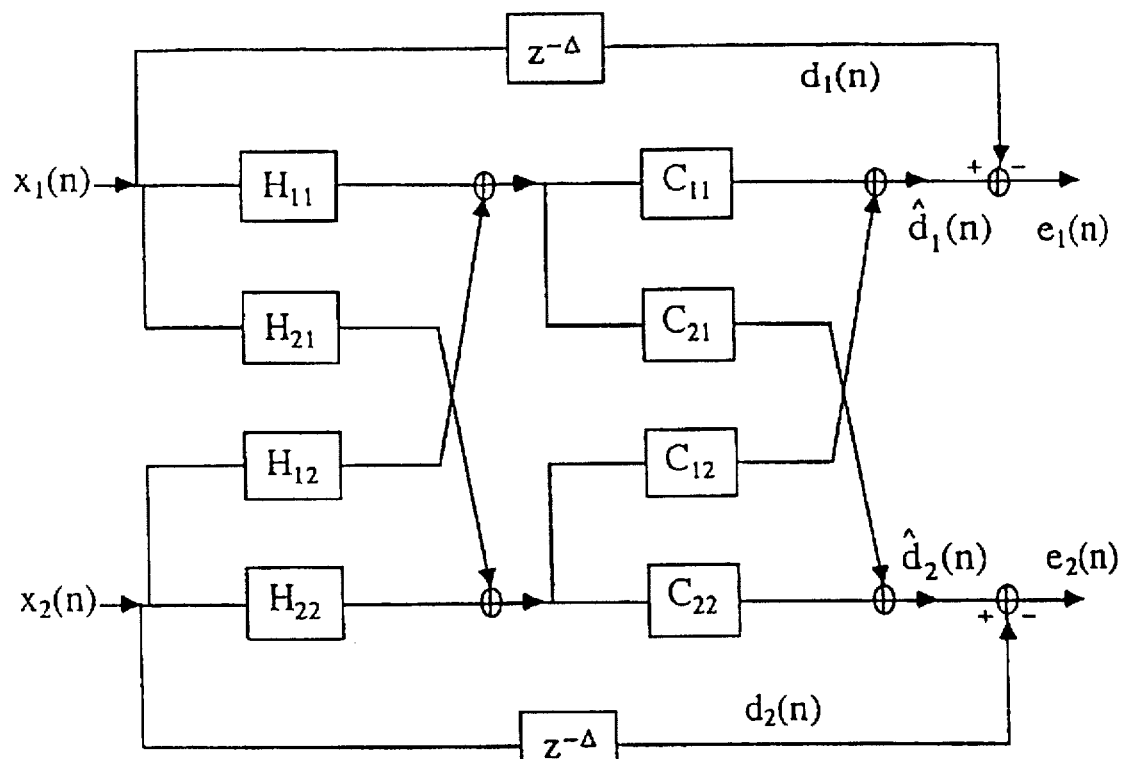
FIG. 5 is a block diagram of a compensated sound reproduction system in accordance with the invention which incorporates a modelling delay of $\Delta$ samples to allow for non-minimum phase components associated with the transfer functions in the matrix C. The desired output signals $d_1(n)$ and $d_2(n)$ are now simply delayed versions of the recorded signals $x_1(n)$ and $x_2(n)$.

We now seek the optimal filter vector to minimise the time averaged error between the actual and desired outputs. In this case the desired output is defined as the signal produced bypassing the training signal through a filter having the desired impulse response. Again this could simply be a pure delay, A samples, or any other modified form of impulse response function. The net block diagram can thus be written in the form shown in FIG. 5. In this case we seek to minimise the time averaged sum of squared errors defined by $$J = E[(d(n) - \hat{d}(n))^T (d(n) - \hat{d}(n))] \quad (22)$$

where E denotes the expectation operator and d(n) is the vector defined by $d^T(n) = [d_1(n)\ d_2(n)]$. Thus, J can be written as $$J = E[(d(n) - R\ h)^T (d(n) - R\ h)] \quad (23)$$

which reduces to the quadratic form $$J = E[d^T(n) d(n)] - 2 E[d^T(n) R] h + h^T E[R^T R] h \quad (24)$$

This function has the minimum defined by $$h_o = [E[R^T R]]^{-1} E[R^T d(n)] \quad (25)$$

and the corresponding minimum mean squared error given by $$J_o = E[d^T(n)d(n)] - E[d^T(n)R]h_o \tag{26}$$

One technique is to use Elliott's stochastic gradient algorithm where one updates the coefficients of the composite filter vector h in accordance with $$h(n+1) = h(n) - \alpha R\, e(n) \tag{27}$$

where $\alpha$ is the convergence coefficient of the algorithm and the instantaneous error vector is defined by $$e(n) = d(n) - \hat{d}(n) \tag{28}$$

The generalisation of the use of this algorithm follows easily from the formulation presented here and the description of the algorithm presented in reference [12]. The advantage of this technique is that the implementation of the algorithm requires only an imperfect knowledge of the elements of the matrix C in order to derive the values of the filtered reference signals used in the coefficient update equation given by equation (27). In the single frequency case the accuracy with which the values of the filters C must be known is well established. More work, however, is required to establish the necessary requirements for the accuracy of the generation of the filtered reference signals in this case.

EXTENSION TO MULTIPLE CHANNELS

Figure 6:
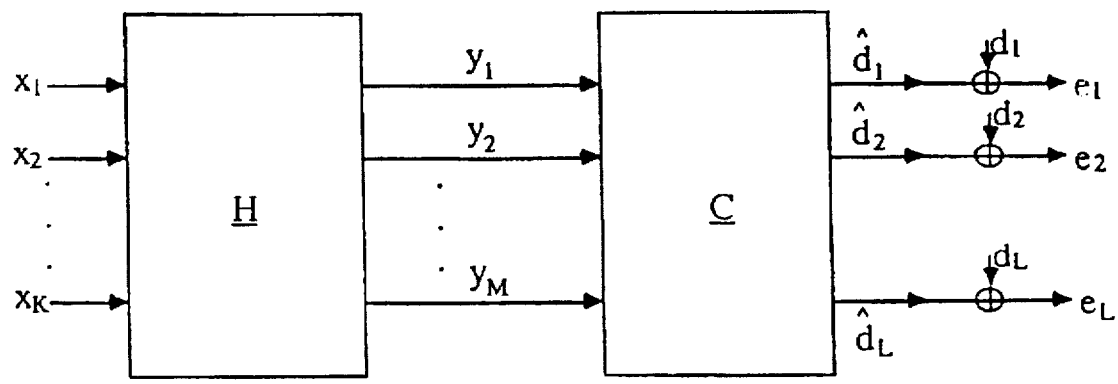
FIG. 6 is a block diagram of a system in accordance with the invention generalised to deal with signals at a plurality K points in space and the best least squares reproduction of these signals at L points in a listening space, where in general $L \geq K$, the recorded signals being $X_k$, the signals output to loudpseakers being $Y_m$ and the reproduced signals being $\hat{d}_d$.
Figure 7:
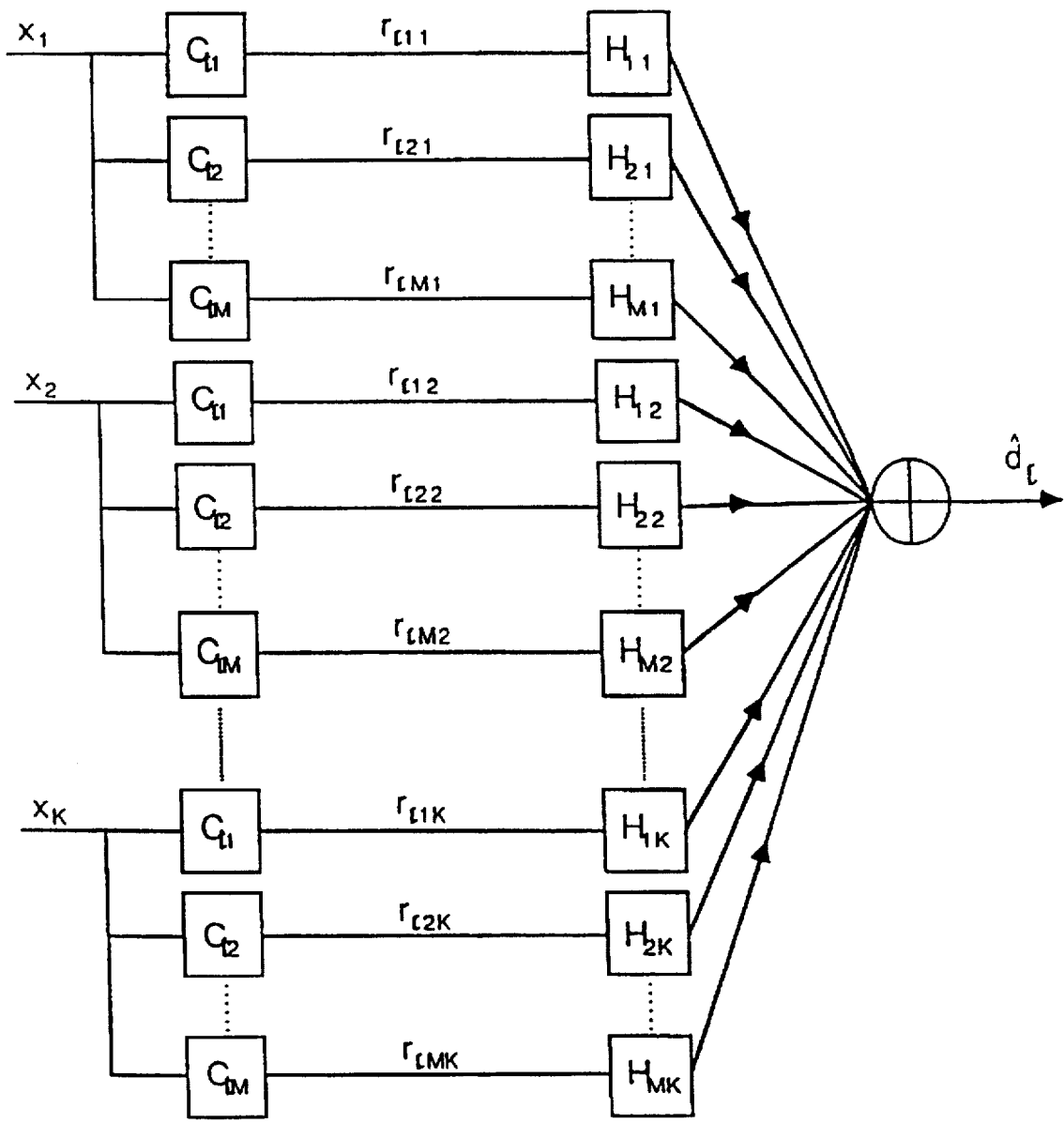
FIG. 7 is a block diagram equivalent to FIG. 4 but representing the generation of the signal at the e'th point in the listening space.

The above techniques are easily extended to deal with the case of multiple channels where, for example, the signals are recorded at K points in the recording space (producing signals $x_k$) and we wish to reproduce a best least squares approximation to these signals ($\hat{d}_l$) at L points in the listening space using M loudspeaker channels (with outputs $y_m$). In general it is assumed that $L \geq M \geq K$. Again we operate on the K recorded signals with an M×K matrix H of filters prior to their transmission via an L×M matrix C of transmission paths. This is illustrated in FIG. 6. The formulation of this general problem is most easily accomplished by again using the transfer function reversal technique. The approach adopted here is identical to that presented by Nelson et al [9]. Thus in matrix form, again working in the frequency domain, we write the vector of M loudpseaker signals and the vector of L reproduced signals as $$y = H\, x, \quad \hat{d} = C\, y \tag{29}$$

If these are now written in terms of the columns $h_k$ of H and the rows $c_l$ of C then we have $$\underline{y} = [\underline{h}_1\, \underline{h}_2 \ldots \underline{h}_K]\, \underline{x}, \quad \underline{d} = \begin{bmatrix} \underline{c}_1^T \\ \underline{c}_2^T \\ \cdot \\ \cdot \\ \cdot \\ \underline{c}_L^T \end{bmatrix} \underline{y} \tag{30}$$

The signal produced at the l'th point in the listening space is thus given by $$\hat{d}_l = c_l^T y = c_l^T (h_1 x_1 + h_2 x_2 \ldots h_K x_K) \tag{31}$$

Transposing this scalar then yields $$\hat{d}_l = h_1^T c_l x_1 + h_2^T c_l x_2 \ldots h_K^T c_l x_K \tag{32}$$

This then demonstrates that the equivalent "reversed transfer function" block diagram can be expressed as shown in FIG.

7. In discrete time, the signal at the l'th point in the listening space can thus be expressed in terms of the convolution $$\hat{d}_l(n) = r_l^T h \tag{33}$$

where the composite tap weight vector h and the l'th filtered reference signal vector $r_l$ are defined by $$\underline{r}_l^T = [\underline{r}_{l11}^T\, \underline{r}_{l21}^T \cdots \underline{r}_{lM1}^T\, |\underline{r}_{l12}^T\, \underline{r}_{l22}^T \cdots \underline{r}_{lM2}^T|\cdots |\underline{r}_{l1K}^T\, \underline{r}_{l2K}^T \cdots \underline{r}_{lMK}^T] \tag{34}$$

$$\underline{h} = [\underline{h}_{11}^T\, \underline{h}_{21}^T \cdots \underline{h}_{M1}^T\, |\underline{h}_{12}^T\, \underline{h}_{22}^T \cdots \underline{h}_{M2}^T|\cdots |\underline{h}_{1K}^T\, \underline{h}_{2K}^T \cdots \underline{h}_{MK}^T]$$

where each of the component vectors are given by the sequences $$\underline{r}_{lmk}^T = [r_{lmk}(n)\, r_{lmk}(n-1) \ldots r_{lmk}(n-I+1)] \tag{35}$$

$$\underline{h}_{mk} = [h_{mk}(0)\, h_{mk}(1) \ldots h_{mk}(I-1)]$$

The net vector of discrete time signals produced at the l points in the listening space can now be written as $$\hat{d}(n) = R\, h \tag{36}$$

where the vector $\hat{d}(n)$ and the matrix R are now defined as $$\underline{\hat{d}}(n) = \begin{bmatrix} \hat{d}_1(n) \\ \hat{d}_2(n) \\ \cdot \\ \cdot \\ \hat{d}_L(n) \end{bmatrix},\quad \underline{R} = \begin{bmatrix} \underline{r}_1^T \\ \underline{r}_2^T \\ \cdot \\ \cdot \\ \underline{r}_L^T \end{bmatrix} \tag{37}$$

The optimal composite tap weight vector which minimises a cost function of the form $$J = E[(d(n) - \hat{d}(n))^T (d(n) - \hat{d}(n))] \tag{38}$$

(where d(n) is now the L-vector of desired impulse responses) is now deduced by following exactly the analysis presented in equations (22) to (26) above. The adaptive coefficient update equation (27) also remains applicable in this general case.

PRACTICAL IMPLEMENTATIONS OF THE INVENTIVE SYSTEMS

Adaptive equalisation and cross-talk suppression of a full audio-bandwidth system may be very costly if the equaliser must operate over the full audio bandwidth. If only low and mid-audio frequency equalisation is required then only the frequencies which are to be equalised need to be passed through the equalising filter. A full bandwidth path must, however, be provided for the audio signals, the equalisation preferably being achieved by adding the suitably filtered low frequency components to the total signal so as to achieve the desired result at a listening point, as shown in FIG. 8.

It should be noted that the required filters for minimum distortion and cross-talk will result in minimum error and so, in accordance with the invention, the error may be used as a criterion for adjusting the filters.

Figure 8:
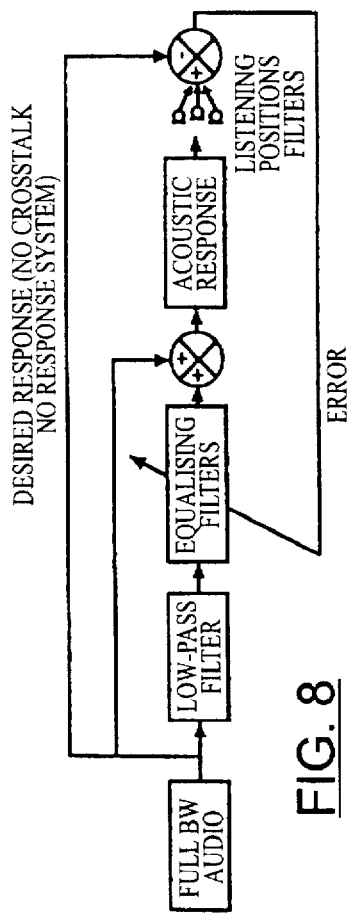
FIG. 8 is a block diagram of a full audio-bandwidth system in accordance with the invention in which an equalising filter is provided only for low and mid-audio frequencies, but a path is provided parallel to that through the equalizing filter to provide a full bandwidth path.
Figure 9:
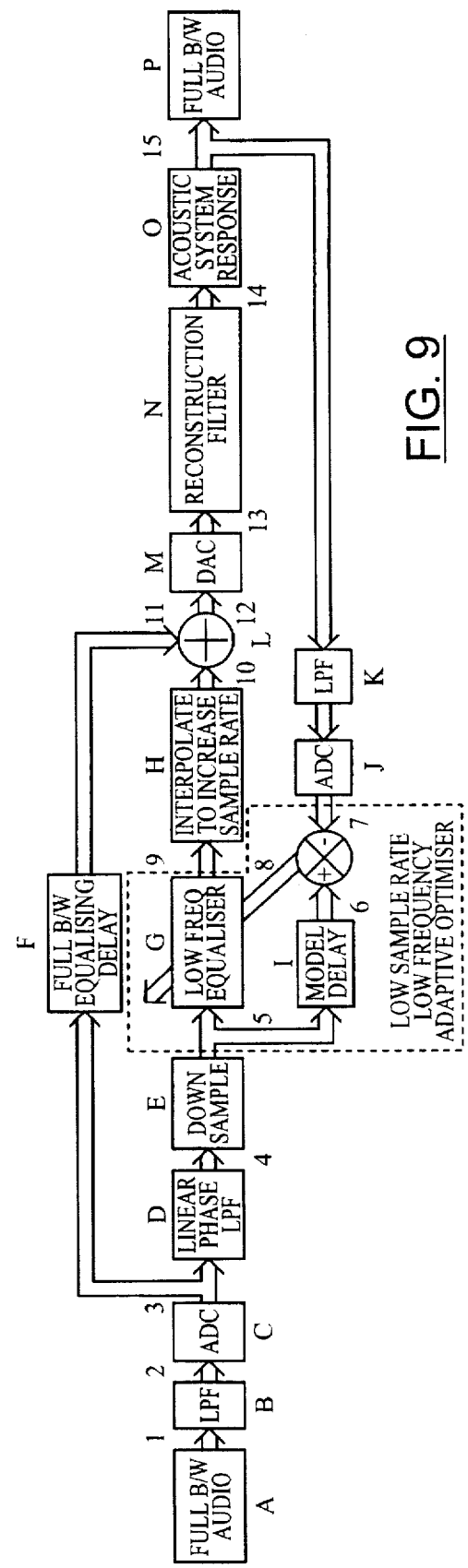
FIG. 9 is a more detailed block diagram of a practical high sample rate full bandwidth audio system working in accordance with the diagram of FIG. 8.

A block diagram of a practical audio response system based on the system of FIG. 8 is shown in FIG. 9.

Full bandwidth audio signals (A) are anti-alias filtered by low pass filters (B) and converted into digital form by analogue-to-digital converters (C). These steps may be unnecessary, and can therefore be omitted in a contemplated modification, since digital audio is commonly available from compact disc players and digital audio tape machines, thus removing the need to digitise analogue audio signals.

The full audio bandwidth signals (3) are then sent both to the low frequency optimiser and through a delay (F) to form part of the output of the optimiser. The delay (F) is required to ensure that, despite any delays that the low frequency components experience during their filtering in the optimiser, both high and low frequency components may emerge to be added in at the same time.

Before being processed by the low frequency optimiser, the full audio bandwidth signals (3) are preferably low pass filtered and down-sampled so as to reduce the sample rate and the amount of processing the optimiser must perform. The low bandwidth signals (5) are then fed both into the low frequency equaliser (G) which consists of an array of adaptive finite impulse response filters, and into the modelling delay (I). The modelling delay allows the filters (G) prior knowledge of the input signals compared with the modelling delay outputs (8). This allows the filters (G) to implement transfer functions with an apparently non-casual part.

The outputs of the modelling delay are compared with the digital representation of the low frequency components of the signals at the actual listening points (15). The error (8) between these signals is then used to drive the adaptive filters (G) so as to minimise itself. The outputs of the adaptive filters (9) are then interpolated so that the sample rate of these signals may be increased to that of the full audio bandwidth signal (11). The signals (11) and (10) are then added to produce the output required for optimum cross-talk suppression and equalisation at the listening point (P).

The digital signals (12) are then converted into analogue form (13) and filtered (N) to remove high frequency distortions produced in the conversion process. The analogue signals are then ready for amplification and playing through loudspeakers in the listening environment (O).

It can be seen that this system prefilters and combines the signals so that cross-talk and amplitude response distortions are removed as far as the listener is concerned.

Figure 10:
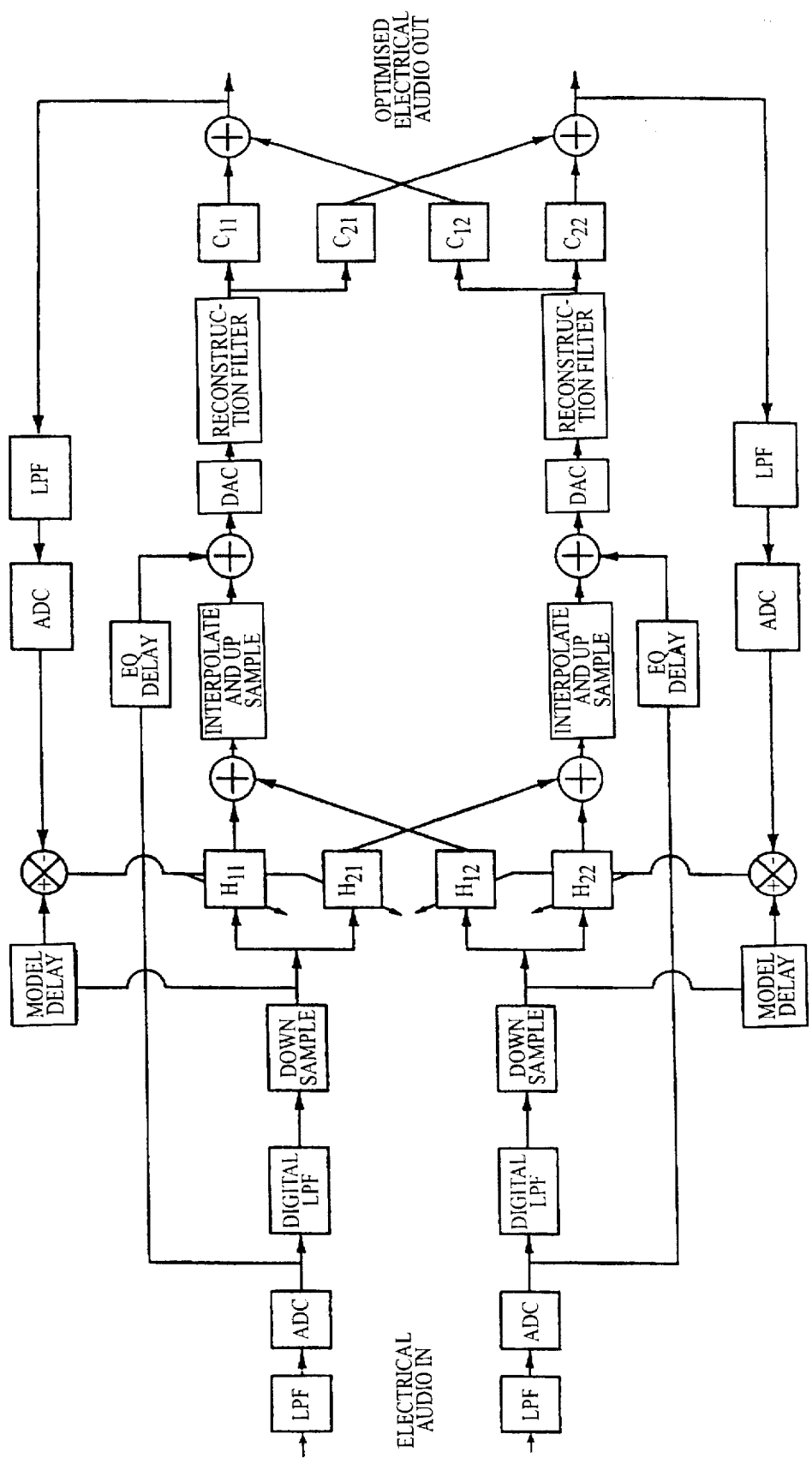
FIG. 10 is a yet more detailed diagram of an optimiser in accordance with FIG. 9.

The block diagram of FIG. 9 has been expanded in FIG. 10 to give a more detailed diagram of a system for stereo reproduction. Most of this diagram is dealt with in the discussion of the simpler block diagram of FIG. 9. It is, however, worth discussing the adaptive filters $H_{11}$, $H_{12}$, $H_{21}$ and $H_{22}$.

The parameters of these filters may be found using a modified "filtered-x" LMS algorithm. In order to do this a model of the external electro-acoustic transfer functions $C_{11}$, $C_{12}$, $C_{21}$ and $C_{22}$ is required. This may also be found adaptively.

The filters $H_{11}$ and $H_{22}$ simply equalise the responses of the two channels. It should be noted that the equalisation is done in the time domain and so the gross phase distortions which accompany "graphic", parametric and other analogue filter equalisation techniques will be avoided.

It should be noted that two sample rates are present in this digital system. We consider that it may be advantageous to use two processors to perform the necessary filtering. The dotted line of FIG. 9 suggests a preferred divide for the processing—one processor handling the optimising while the other takes care of delay equalisation, down-sampling, interpolation and up-sampling.

REFERENCES

1. K. D. FARNSWORTH, P. A. NELSON and S. J. ELLIOTT 1985 *Proceedings of the Institute of Acoustics, Autumn Conference:* Reproduced Sound (Windermere). Equalisation of room acoustic responses over spatially distributed regions.
2. P. M. CLARKSON, J. MOURJOPOULOS and J. K. HAMMOND 1985 *Journal of the Audio Engineering Society* 33, 127–132. Spectral, phase and transient equalisation for audio systems.
3. B. S. ATAL and M. R. SCHROEDER 1962 U.S. Pat. No. 3,236,949. Apparent sound source translator.
4. P. DAMASKE 1971 *Journal of the Acoustical Society of America* 50. Head-related two-channel stereophony with loudspeaker reproduction.
5. N. SAKAMOTO, T. GOTOH, T. KOGURE and M. SHIMBO 1981 *Journal of the Audio Engineering Society* 29, 794–799. Controlling sound-image localisation in stereophonic sound reproduction, Part I.
6. N. SAKAMOTO, T. GOTOH, T. KOGURE, M. SHIMBO and A. H. CLEGG 1981 *Journal of the Audio Engineering Society* 30, 719–721. Controlling sound-image localisation in stereophonic sound reproduction, Part II.
7. S. T. NEELY and J. B. ALLEN 1979 *Journal of the Acoustical Society of America* 66, 165–169. Invertibility of a room impulse response.
8. S. J. ELLIOTT, I. M. STOTHERS and P. A. NELSON 1987 *IEEE Transactions on Acoustics, Speech and Signal Processing* 35, 1423–1434. A multiple error LMS algorithm and its application to the active control of sound and vibration.
9. P. A. NELSON, J. K. HAMMOND and S. J. ELLIOTT 1988 *Proceedings of the Institute of Acoustics* 10, 589–611. Linear least squares estimation problems in the active control of stationary random sound fields.
10. B. WIDROW and S. D. STEARNS 1985 *Adaptive Signal Processing* (see Chapter 10). Prentice-Hall, Englewood Cliffs.
11. S. L. MARPLE 1987 *Digital Spectral Analysis with Applications* (see Chapter 15). Prentice-Hall, Englewood Cliffs.
12. S. J. ELLIOTT and P. A. NELSON 1987 *ISVR Memorandum* no. 679. Algorithms for the active control of periodic sound and vibration.

We claim:

1. A sound reproduction system comprising: a plurality of audio signal sources for supplying a plurality of electrical signals, each electrical signal representing an acoustic audio signal occurring at a corresponding one of a plurality of points in a first space; a plurality of speakers connected to form a plurality of speaker channels, M, for reproducing the acoustic audio signals at a plurality of points, L, in a second space, each of said speakers having an electrical signal input and being operative to generate an acoustic audio output signal in response to a signal supplied to the electrical signal input, wherein transmission paths exist between the electrical signal input of each speaker and the plurality of points, L, in the second space, which transmission paths are represented by transfer functions, wherein said sound reproduction system further comprises electrical filter means connected in signal paths between each audio signal source and said electrical signal input of each speaker for modifying the electrical signals supplied by said audio signal sources and delivering a modified signal to the said electrical signal input of each speaker, said filter means having filter characteristics determined by measuring the transfer functions of the transmission paths, and wherein M and L are each greater than unity.

2. A system as claimed in claim 1 characterised in that the filter means are provided by an inverse digital filter matrix (M) of which the matrix elements ($H_{ij}$) are determined, or have been determined, by a least squares technique.

3. A stereophonic form of reproduction system comprising a system as claimed in claim 1 for effecting stereophonic reproduction in two signal channels and an optimiser unit interposed between speaker outputs of the system and the speakers thereof, the optimiser unit having respective optimiser inputs connected to the speaker outputs, respective optimiser outputs connected to the speakers, and an input for receiving a microphone signal from a microphone placed in the reproduced field.

4. The system as claimed in claim 1 wherein said filter characteristics of said filter means are determined by periodic measurements of acoustic audio signals on the transmission paths.

5. The system as claimed in claim 4 wherein said filter characteristics of said filter means are variable and are adjusted periodically in response to measurements of acoustic audio signals on the transmission paths.

6. The system as claimed in claim 5 wherein said filter characteristics at least partly correct for acoustic cross-talk at the plurality of points in the second space.

7. The system as claimed in claim 5 wherein said filter characteristics at least partly correct for acoustic cross-talk at the plurality of points in the second space.

8. The system of claim 7 wherein the second space has an acoustic response and said filter characteristics are selected to compensate substantially for the acoustic response.

9. The system as claimed in claim 8 wherein said filter characteristics are represented by a matrix which is the inverse to a matrix representing the transfer functions of the transmission paths.

10. A stereophonic form of reproduction system as claimed in claim 1 wherein said filter means have inputs connected to receive electrical signals derived from said audio signal sources and an input for receiving a microphone signal from a microphone placed in the second space.

11. A sound reproduction system as claimed in claim 1, wherein said filter means are inverse digital filter means operable so as to exhibit a filter characteristic conforming to an algorithm such that electrical signals in said signal paths are modified in amplitude and phase in a manner such that, at at least one pair of points spaced apart in the second space by a distance corresponding to the spacing of the human ears, the outputs from the speakers are mutually compensatory, thereby diminishing cross-talk, compensating for the reverberant field of the second space, and compensating also for the frequency response of the speakers.

12. A system as defined in claim 1 further comprising means for periodically detecting, at said plurality of points, L, acoustic audio output signals produced by said speakers, said means for periodically detecting providing information identifying amplitude and phase of the acoustic audio output signals for periodically determining the filter characteristics of said filter means.

13. The system as claimed in claim 12 wherein said detecting means are coupled to said filter means for supplying the information provided by said detecting means to periodically adjust the filter characteristics of said filter means.

14. A system as claimed in claim 1 wherein M is less than or equal to L.

15. A sound reproduction system as claimed in claim 1, wherein said filter characteristics have values selected to minimize the sum of errors between actual and desired values of acoustic audio signals at all of the points L in the second space.

16. A sound reproduction system comprising: a plurality of audio signal sources for supplying a plurality of electrical signals, each electrical signal representing an acoustic audio signal occurring at a corresponding one of a plurality of points in a first space; a plurality of speakers connected to form a plurality of speaker channels, M, for reproducing the acoustic audio signals at a plurality of points, L, in a second space, each of said speakers having an electrical signal input and being operative to generate an acoustic audio output signal in response to a signal supplied to the electrical signal input, wherein transmission paths exist between the electrical signal input of each speaker and the plurality of points, L, in the second space, which transmission paths are represented by transfer functions, wherein said sound reproduction system further comprises electrical filter means connected in signal paths between each audio signal source and said electrical signal input of each speaker for modifying the electrical signals supplied by said audio signal sources and delivering a modified signal to the said electrical signal input of each speaker, said filter means having filter characteristics determined by minimizing a measure of total error between audio signals actually reproduced in the second space and audio signals desired to be so reproduced.

17. A sound reproduction system comprising: an audio signal source for supplying electrical signals representing acoustic audio signals occurring at at least one point in a first space; a plurality of speakers connected to form a plurality of speaker channels, M, for reproducing the acoustic audio signals at a plurality of points, L, in a second space, each of said speakers having an electrical signal input and being operative to generate an acoustic audio output signal in response to a signal supplied to the electrical signal input, wherein transmission paths exist between the electrical signal of each speaker and the plurality of points, L, in the second space, which transmission paths are represented by transfer functions, wherein said sound reproduction system further comprises electrical filter means connected in signal paths between said audio signal source and said electrical signal input of each speaker for modifying the electrical signals supplied by said audio signal source and delivering a modified signal to the said electrical signal input of each speaker, said filter means having filter characteristics determined by using measurements of the transfer functions of the transmission paths, and wherein M and L are each greater than unity, the filter means being provided by an inverse digital filter matrix (H) of which the matrix elements $(H_{ij})$ are determined, or have been determined, by a least squares technique, and the least squares technique is applied so as to minimize the sum of the squared errors resulting from the difference between the actual system impulse response and a desired impulse response.

18. A system as claimed in claim 17 characterized in that the desired impulse response is a desired impulse response of a room.

19. A system as claimed in claim 17 characterized in that the least squares technique is applied by Considering the system response to a spectrally broad input signal, the minimum means squared error being determined by use of an equation of the form $$J_o = E[d^T(n)d(n)] - E[d^T(n)R]h_o$$

the filter coefficients being determined by an equation of the form $$h_o = [E[R^T R]]^{-1} E[R^T d(n)]$$

and employing an algorithm of the form $$h(n+1) = h(n) - \alpha Re(n)$$

to determine said minimum.

20. The system of claim 18, further comprising: a low-pass filter connected ahead of said filter means and a delay means forming a bypass path for transmitting a full bandwidth signal around said filter.

21. The system of claim 20 wherein said electrical filter means comprise: digital filters which have signal outputs and are down-sampled to reduce the rate at which the electrical signal are sampled; and interpolation means connected to said signal outputs for increasing the rate at which signals at said signal outputs are sampled.

22. The system of claim 21, wherein said filter means further comprise a modelling delay member for providing delayed versions of the electrical signals to said digital filters.

23. A sound reproduction system comprising: an audio signal source for supplying electrical signals representing acoustic audio signals occurring at at least one point in a first space; a plurality of speakers connected to form a plurality of speaker channels, M for reproducing the acoustic audio signals at a plurality of points, L, in a second space, each of said speakers having an electrical signal input and being operative to generate an acoustic audio output signal in response to a signal supplied to the electrical signal input, wherein transmission paths exist between the electrical signal input of each speaker and the plurality of points, L, in the second space, which transmission paths are represented by transfer functions, wherein said sound reproduction system further comprises electrical filter means connected in signal paths between said audio signal source and said electrical signal input of each speaker for modifying the electrical signals supplied by said audio signal source and delivering a modified signal to the said electrical signal input of each speaker, said filter means having filter characteristics determined by using measurements of the transfer functions of the transmission paths, and wherein M and L are each greater than unity, whereby said filter characteristics of said filter means are determined by measurements of acoustic audio signals on the transmission paths, wherein said filter characteristics of said filter means are variable and are adjusted periodically in response to measurements of acoustic audio signals on the transmission paths, wherein the measurements are performed at least periodically, wherein said filter characteristics at least partly correct for acoustic cross-talk at the plurality of points in the second space, wherein the second space has an acoustic response and said filter characteristics are selected to compensate substantially for the acoustic response, wherein said filter characteristics are represented by a matrix which when convolved with a matrix representing the transfer functions of the transmission paths, produce the desired impulse responses at the L points in the second space, and wherein the transmission paths have an actual impulse response and are associated with a desired impulse response, and said filter characteristics are selected to minimize the sum of the squared errors resulting from the difference between the actual impulse response and the desired impulse response.

* * * * *